(12) United States Patent
Lu et al.

(10) Patent No.: US 12,080,821 B2
(45) Date of Patent: Sep. 3, 2024

(54) SILICON CARBIDE-BASED LATERAL PN JUNCTION EXTREME ULTRAVIOLET DETECTOR BASED ON SELECTIVE-AREA ION IMPLANTATION, AND PREPARATION METHOD THEREOF

(71) Applicant: NANJING UNIVERSITY, Nanjing (CN)

(72) Inventors: Hai Lu, Nanjing (CN); Dong Zhou, Nanjing (CN); Weizong Xu, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 0 days.

(21) Appl. No.: 18/588,391

(22) Filed: Feb. 27, 2024

(65) Prior Publication Data

US 2024/0204126 A1    Jun. 20, 2024

Related U.S. Application Data

(63) Continuation of application No. PCT/CN2022/122521, filed on Sep. 29, 2022.

(30) Foreign Application Priority Data

Oct. 14, 2021   (CN) .......................... 202111196401.5

(51) Int. Cl.
| | |
|---|---|
| *H01L 31/103* | (2006.01) |
| *H01L 31/0224* | (2006.01) |
| *H01L 31/0312* | (2006.01) |
| *H01L 31/18* | (2006.01) |

(52) U.S. Cl.
CPC .. *H01L 31/1037* (2013.01); *H01L 31/022408* (2013.01); *H01L 31/0312* (2013.01); *H01L 31/1812* (2013.01)

(58) Field of Classification Search
CPC ......... H01L 31/1037; H01L 31/022408; H01L 31/0312
See application file for complete search history.

(56) References Cited

FOREIGN PATENT DOCUMENTS

| | | |
|---|---|---|
| CN | 110544731 A | 12/2019 |
| CN | 112909109 A | 6/2021 |
| JP | H07162024 A | 6/1995 |

*Primary Examiner* — Suberr L Chi
(74) *Attorney, Agent, or Firm* — Nitin Kaushik

(57) ABSTRACT

The present invention discloses a novel silicon carbide-based lateral PN junction extreme ultraviolet detector with enhanced detection performance based on selective-area ion implantation, including an N-type ohmic contact lower electrode, an N-type substrate and a lightly-doped epitaxial layer which are connected sequentially from bottom to top, where the lightly-doped epitaxial layer is an N-type lightly-doped epitaxial layer or a P-type lightly-doped epitaxial layer; in a case that the lightly-doped epitaxial layer is an N-type or P-type lightly-doped epitaxial layer, a P-type or N-type well region is formed on the surface of the N-type or P-type lightly-doped epitaxial layer through the selective-area ion implantation, a P-type or N-type ohmic contact upper electrode is arranged on the P-type or N-type well region, and the P-type or N-type ohmic contact upper electrode is provided with a metal conductive electrode along its periphery.

10 Claims, 7 Drawing Sheets

SILICON CARBIDE-BASED LATERAL PN JUNCTION EXTREME ULTRAVIOLET DETECTOR BASED ON SELECTIVE-AREA ION IMPLANTATION, AND PREPARATION METHOD THEREOF

CROSS-REFERENCE TO RELATED APPLICATIONS

The application claims priority to Chinese patent application No. 2021111964015, filed on Oct. 14, 2021, the entire contents of which are incorporated herein by reference.

TECHNICAL FIELD

The present invention relates to a novel silicon carbide (SiC)-based lateral PN junction extreme ultraviolet (EUV) detector based on selective-area ion implantation, and a preparation method thereof, and belongs to the technical field of photoelectric detection of semiconductor devices.

BACKGROUND

An EUV detection technology has a wide application prospect in the technological process of photolithography of an integrated circuit of 7 nm node or below, and in many scientific research and production fields such as plasma diagnosis, astrophysics, high-energy physics and satellite space environmental monitoring. The EUV detection technology is mainly used to detect short-wavelength and high-energy ultraviolet light with a wavelength ranging from 10 nm to 200 nm. Compared with visible light band (400-760 nm) and conventional ultraviolet band (200-400 nm), EUV light has the characteristics of shallow penetration depth and high photon energy. These special properties of EUV photons limit the research and development of an EUV detector, which has also become a key factor restricting the development of EUV detection technology. Firstly, EUV photons have a large absorption coefficient in a semiconductor material such as silicon and a penetration depth generally lower than 10 nm, and the incident EUV photons are easily absorbed by non-active regions such as an ohmic contact layer and a passivation layer on the surface of the detector, resulting in very low detection efficiency of the detectors; secondly, EUV photons have high energy, and high-energy photon irradiation could lead to defect state generation within the devices and brings a series of harmful effects such as heat accumulation and noise level rise, resulting in degraded performance of the detectors; meanwhile, the EUV detector is usually required to face a harsh working environment, and by taking ultraviolet photolithography as an example, the EUV detector as a core part in the system is required to be irradiated by high-energy photons with a cumulative dose up to 1 $MJ/cm^2$, which challenges the reliability and long-term stability of the EUV detector.

At present, detectors for conventional ultraviolet band generally cannot meet the requirements of efficiently and stably working in an EUV band for a long term. A silicon-based detector is limited by the influence of narrow bandgap, low critical displacement energy and low thermal conductivity coefficient of the silicon material, and thus has drawbacks including high noise level, low irradiation resistance and poor temperature stability. Comparatively, semiconductor material 4H—SiC with a wide bandgap has the characteristics of visible blindness, high critical displacement energy, high thermal conductivity coefficient and high chemical stability, and has significant material performance advantages in preparing photoelectric detection devices working in ultraviolet band. However, existing SiC-based ultraviolet detectors still have drawbacks. For example a SiC-based Schottky junction detector is prone to generate positive vacancies under the irradiation of high-energy EUV photons, resulting in a reduction of Schottky barrier height due to the image force effect and further resulting in an increase of leak current of the detector. Meanwhile a SiC-based traditional structure PN junction detector suffers from strong absorption of EUV photons by the non-active surface region, resulting in very low detection efficiency of the device in EUV band. It thus can be seen that how to effectively improve the detection efficiency and the device stability of EUV detectors is one of the key scientific and technological problems in design and preparation of a 4H—SiC-based EUV detector.

SUMMARY

The present invention provides a novel SiC-based lateral PN junction EUV detector based on selective-area ion implantation, and a preparation method thereof, so as to solve the problem that the detector has low efficiency, low device stability and low long-range reliability in EUV band.

To solve the above technical problem, the present invention adopts the following technical solution:

a novel SiC-based lateral PN junction EUV detector based on selective-area ion implantation includes an N-type ohmic contact lower electrode, an N-type substrate and a lightly-doped epitaxial layer which are connected sequentially from bottom to top, where the lightly-doped epitaxial layer is an N-type lightly-doped epitaxial layer or a P-type lightly-doped epitaxial layer; in a case that the lightly-doped epitaxial layer is an N-type lightly-doped epitaxial layer, a P-type well region is formed on the surface of the N-type lightly-doped epitaxial layer through selective-area ion implantation, a P-type ohmic contact upper electrode is arranged on the P-type well region, and the P-type ohmic contact upper electrode is connected to a metal conductive electrode which is arranged along its periphery; and in a case that the lightly-doped epitaxial layer is a P-type lightly-doped epitaxial layer, an N-type well region is formed on the surface of the P-type lightly-doped epitaxial layer through selective-area ion implantation, an N-type ohmic contact upper electrode is arranged on the N-type well region, and the N-type ohmic contact upper electrode is connected to a metal conductive electrode along its periphery.

The P-type or N-type ohmic contact upper electrode, and the P-type or N-type well region formed on the N-type or P-type SiC lightly-doped epitaxial layer through selective-area ion implantation are used to form an ohmic contact; the non-implanted region in the N-type or P-type SiC lightly-doped epitaxial layer is an active layer for receiving incident photons, and a low doping concentration enables the device to form a wider lateral broadened depletion region under a low bias voltage; and the metal conductive electrode can effectively improve the current spreading and carrier collection abilities of the device, which is also used for packaging via wire bonding. In a case that the lightly-doped epitaxial layer is the N-type lightly-doped epitaxial layer, the N-type ohmic contact lower electrode is connected to a positive electrode in the test; and in a case that the lightly-doped epitaxial layer is the P-type lightly-doped epitaxial layer, the N-type ohmic contact lower electrode is connected to a negative electrode in the test.

The P-type or N-type well region of the present application refers to the P-type well region or the N-type well region, and other similar expressions have similar meanings.

Being different from the traditional structure PN junction detector and Schottky structure detector working in conventional ultraviolet band, the novel SiC-based EUV detector adopts an ion implantation technology to form a lateral PN junction on the device surface, and the active region of the device is subjected to lateral depletion broadening under reverse bias, so that incident EUV photons can directly enter an active absorption region located on the surface of the device and between the P-type or N-type well regions, thereby effectively avoiding the strong absorption of EUV photons in the thick ohmic contact layer on the surface of traditional devices as well as its transition layer, which effectively improves the detection efficiency of the device in EUV band, especially vacuum ultraviolet band; in addition, the detector adopts a PN junction structure working under reverse bias state, and compared with Schottky structures, the built-in electric field strength and the leak current level of the device are less affected by the irradiation of high-energy photons and temperature change of working environment, thereby effectively improving the irradiation resistance of the device and the ability of working under extreme temperature conditions.

To avoid reach-through, in a case that the lightly-doped epitaxial layer is the P-type lightly-doped epitaxial layer, a P-type heavily-doped epitaxial layer is arranged between the P-type lightly-doped epitaxial layer and the N-type substrate.

To further improve quantum efficiency, the P-type or N-type well regions are distributed on the surface of the N-type or P-type lightly-doped epitaxial layer at intervals with a fill factor of 10-90% (the fill factor is a ratio of the sum of surface areas of all the P-type or N-type well regions to the surface area of the N-type or P-type lightly-doped epitaxial layer before selective-area ion implantation). The preferred fill factor is 40%. A lateral PN junction is formed between the P-type or N-type well regions formed by ion implantation and the N-type or P-type region without ion implantation, electrons and holes generated by incident EUV photons are separated under the combined action of a built-in electric field and a drift electric field in the PN junction to form a photo-response current, thereby detecting EUV photons. Further preferably, the P-type or N-type well region is of grid bar shapes, mesh shapes or ring shapes.

To further improve the performance of the device, the material of the N-type substrate is 4H—SiC; and the material of the N-type or P-type lightly-doped epitaxial layer is also 4H—SiC. Further preferably, the doping concentration of the N-type SiC substrate is $1\times10^{18}$ cm$^{-3}$ to $1\times10^{20}$ cm$^{-3}$, more preferably, $1\times10^{19}$ cm$^{-3}$; the doping concentration of the N-type or P-type SiC lightly-doped epitaxial layer is less than $1\times10^{16}$ cm$^{-3}$, further preferably, $1\times10^{14}$ cm$^{-3}$ to $1\times10^{16}$ cm$^{-3}$, more preferably, $3\times10^{14}$ cm$^{-3}$; and the average doping concentration of the P-type or N-type well region formed by ion implantation is higher than $1\times10^{17}$ cm$^{-3}$, further preferably, $1\times10^{17}$ cm$^{-3}$ to $1\times10^{19}$ cm$^{-3}$, more preferably, $3\times10^{18}$ cm$^{-3}$. The thickness of the N-type or P-type SiC lightly-doped epitaxial layer is greater than 1 µm, more preferably 5 µm; and the depth of the P-type or N-type well region is less than 1 µm, more preferably, 200 nm.

To ensure the comprehensive high performance of the device, the material of the P-type or N-type ohmic contact upper electrode is one or a mixture of more than two of nickel, titanium, aluminum and gold in any ratio, preferably, a nickel layer with a thickness of 100-300 nm; the material of the N-type ohmic contact lower electrode is one or a mixture of more than two of nickel, titanium, aluminum and gold in any ratio, preferably, a nickel layer, a titanium layer, an aluminum layer and a gold layer which are connected sequentially from top to bottom, where a thickness of the nickel layer is 30-40 nm, a thickness of the titanium layer is 40-60 nm, a thickness of the aluminum layer is 90-110 nm, and a thickness of the gold layer is 90-110 nm; the total thickness of the metal conductive electrode is at least 1 µm, preferably, the metal conductive electrode includes a titanium layer and a gold layer, a thickness of the titanium layer is 450-550 nm, and a thickness of the gold layer is 450-550 nm; and the metal conductive electrode includes a Pad region for wire bonding and a grid region for electrical conduction, where preferably, a side length of the Pad region is 90-110 µm, and a width of the grid region is 25-35 µm, so that the packaging of the device is facilitated, and the electrical conduction and the effective area of the active region of the device can be better ensured.

The working principle of the above solution is as follows: the device forms an incompletely filled P-type or N-type well region in the N-type or P-type lightly-doped epitaxial layer on the surface of the device through a selective-area ion implantation technology, a lateral PN junction is formed between the P-type or N-type well region and the N-type or P-type lightly-doped epitaxial layer without implantation, the PN junction depletion region is laterally broadened under a reverse bias voltage and is pinched off, and at this time, the active absorption region of the device in EUV band is the region without ion implantation in the N-type or P-type lightly-doped epitaxial layer. Therefore, the incident EUV photons can directly enter the active region of the device without passing through any surface structure, which greatly improves the effective absorption of EUV photons. The electrons and holes generated by the incident EUV photons are separated under the action of the junction region electric field, and these electrons and holes are collected by a negative electrode and a positive electrode of the device, respectively, and form a light current, thereby detecting EUV photons.

A preparation method of the novel SiC-based lateral PN junction EUV detector based on selective-area ion implantation includes the following steps sequentially:

1) epitaxially growing an N-type lightly-doped epitaxial layer or epitaxially growing a P-type heavily-doped epitaxial layer and a P-type lightly-doped epitaxial layer sequentially on an upper surface of an N-type substrate, preferably, epitaxially growing an N-type or P-type heavily-doped and lightly-doped epitaxial layer on the upper surface of the substrate through a high-temperature chemical vapor deposition (CVD) method;

2) depositing a mask layer on the epitaxial wafer so as to spin-coat a layer of photoresist on the mask layer, and forming a photoresist pattern through exposure and development to define an ion implantation mask region, preferably, depositing the mask layer on the epitaxial wafer by a plasma enhanced chemical vapor deposition (PECVD) or low-pressure chemical vapor deposition (LPCVD) method;

3) etching the mask layer by taking the photoresist pattern as a mask, and forming an ion implantation mask on the surface of the N-type or P-type lightly-doped epitaxial layer, preferably, etching the mask layer by a reactive ion etching (RIE) method or a wet etching method;

4) performing the selective-area ion implantation on the surface of the N-type or P-type lightly-doped epitaxial layer, and performing thermal annealing treatment to activate impurities, preferably, performing ion implantation for multiple times with different energies to obtain a uniform doping concentration profile in the implantation region;

5) depositing an N-type ohmic contact electrode on the lower surface of the substrate, and performing high-temperature annealing to form an N-type ohmic contact, preferably, depositing the N-type ohmic contact electrode by a physical vapor deposition (PVD) method;

6) spin-coating a photoresist on the surface of the N-type or P-type lightly-doped epitaxial layer; according to a photoresist pattern obtained through exposure and development, depositing a P-type or N-type ohmic contact upper electrode on the P-type or N-type well region formed by selective-area ion implantation, and performing high-temperature annealing to form a P-type or N-type ohmic contact, preferably, depositing the P-type or N-type ohmic contact upper electrode by the PVD method;

7) depositing a metal conductive electrode at an edge position of the P-type or N-type ohmic contact upper electrode to complete the preparation of the novel SiC-based lateral PN junction EUV detector based on selective-area ion implantation, preferably, depositing the metal conductive electrode by the PVD method.

In step 4), the temperature of the thermal annealing treatment is preferably 1600° C. to 1650° C., and the time is 20-30 min. In step 6), the temperature of the high-temperature annealing is 800-850° C., and the time is preferably 2-3 min.

The preparation of the P-type or N-type well region distributed at intervals includes: in step 1), in a case that the lightly-doped epitaxial layer is a P-type lightly-doped epitaxial layer, epitaxially growing a P-type heavily-doped epitaxial layer on the upper surface of the N-type substrate, and then epitaxially growing the P-type lightly-doped epitaxial layer on the P-type heavily-doped epitaxial layer; in step 3), etching the mask layer on the N-type or P-type lightly-doped epitaxial layer at intervals according to the photoresist pattern obtained by the exposure and development, so that a partial region on the N-type or P-type lightly-doped epitaxial layer remains the mask layer as the ion implantation mask, and the other region is bare SiC material; and in step 4), forming the P-type or N-type well region distributed at intervals on the N-type or P-type lightly-doped epitaxial layer with the mask layer through P-type or N-type ion implantation, the region on the surface of the N-type or P-type lightly-doped epitaxial layer where the mask layer remains being an active absorption region, thereby implementing the preparation of the P-type or N-type well region distributed at intervals.

Technologies not mentioned in the present invention are referenced to the prior art.

According to the novel SiC-based lateral PN junction EUV detector based on selective-area ion implantation of the present invention, the strong absorption of EUV photons by the non-active surface region of the traditional structure PN junction detector is effectively avoided, and the detection efficiency of the detector in EUV band is effectively improved; meanwhile, the potential problems of Schottky junction detectors in irradiation stability and temperature stability when being applied to strong radiation and high-temperature environments are effectively avoided; and the inconsistency of device performance caused by epitaxial memory effect and cavity contamination is effectively avoided, and meanwhile, the device is not required to be fabricated by processes that affect the interface quality of the device, such as surface etching treatment, the device's fabrication process is well-adapted and standardized mass production is feasible.

Figure 1:
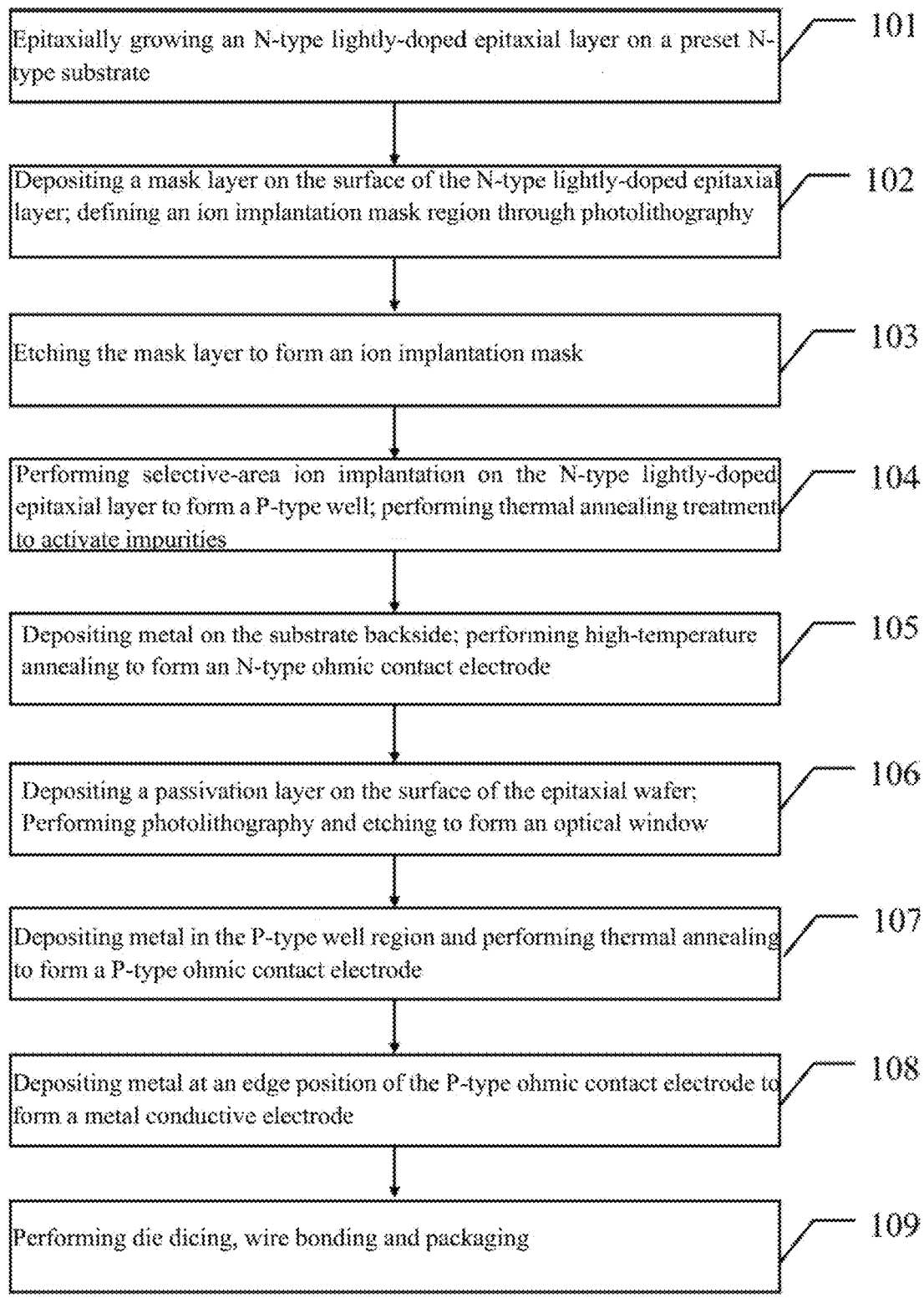
FIG. 1 shows a flowchart of the preparation method for the novel SiC-based lateral PN junction EUV detector based on selective-area ion implantation according to Embodiment 1 of the present invention.

In the drawings, 1 represents an N-type ohmic contact lower electrode; 2 represents an N-type SiC substrate; 3 represents an N-type SiC lightly-doped epitaxial layer; 4 represents a P-type well region; 5 represents a P-type ohmic contact upper electrode; 6 represents a metal conductive electrode; and 7 represents a $SiO_2$ passivation layer.

DETAILED DESCRIPTION OF THE EMBODIMENTS

For a better understanding of the present invention, the content of the present invention is further illustrated below with reference to embodiments. However, the content of the present invention is not limited to the following embodiments.

Embodiment 1

Figure 2:
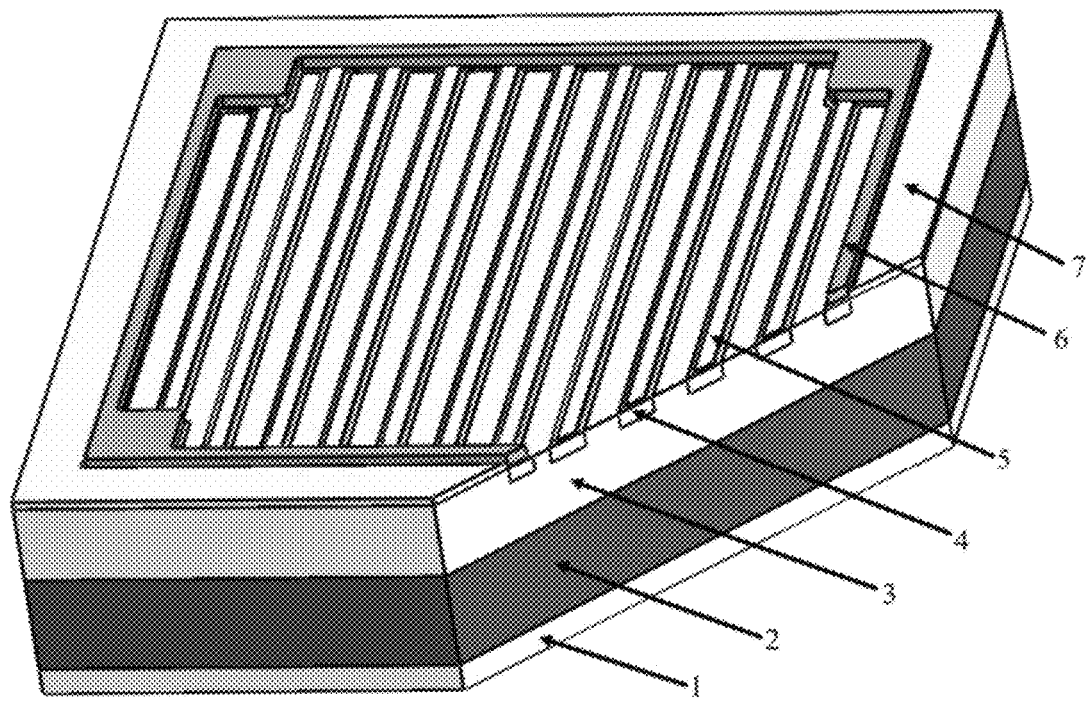
FIG. 2 shows a schematic cross-sectional diagram of the novel SiC-based lateral PN junction EUV detector based on selective-area ion implantation according to Embodiment 1 of the present invention.

As shown in FIG. 2, a novel SiC-based lateral PN junction EUV detector based on selective-area ion implantation includes an N-type ohmic contact lower electrode 1, an N-type SiC substrate 2 and an N-type SiC lightly-doped epitaxial layer 3 which are connected sequentially from bottom to top, where a grid-bar-shaped P-type well region 4 is formed on the surface of the N-type SiC lightly-doped epitaxial layer 3 through selective-area ion implantation, a P-type ohmic contact upper electrode 5 is arranged on the P-type well region 4, the P-type ohmic contact upper electrode 5 is provided with a metal conductive electrode 6 along its periphery, and the metal conductive electrode 6 is provided with a SiO$_2$ passivation layer 7 along its periphery. The well width of the P-type well region 4 is 5 μm, the distance between wells is 5 μm, the well depth is about 200 nm, and the fill factor (a ratio of a sum of surface areas of all the P-type well regions to a total surface area of the N-type lightly-doped epitaxial layer before selective-area ion implantation) is 40%; and the P-type ohmic contact upper electrode 5 is of a grid bar shape including bar-type electrodes, the width of the bar-type electrodes is 3 μm, and the distance between the bar-type electrodes is 7 μm.

As shown in FIG. 1, the preparation process of a device is as follows:

Step 101: epitaxially growing an N-type SiC lightly-doped epitaxial layer 3 with a thickness of 5 μm and a doping concentration of $3\times10^{14}$ cm$^{-3}$ on an N-type SiC substrate 2 with a doping concentration of $1\times10^{19}$ cm$^{-3}$ and a thickness of 350 μm by a high-temperature chemical vapor deposition (CVD) method;

Step 102: depositing a SiO$_2$ mask layer with a thickness of 1500 nm on the surface of the N-type SiC lightly-doped epitaxial layer 3 by a plasma-enhanced chemical vapor deposition (PECVD) method, and then spin-coating a photoresist layer on the surface of the mask layer, and forming a photoresist pattern through exposure and development to define an ion implantation mask region;

Step 103: taking the photoresist pattern formed in Step 102 as an etching mask, etching the SiO$_2$ mask layer deposited in Step 102 at intervals by a reactive ion etching (RIE) method, after the thickness of the remaining SiO$_2$ mask layer is about 100 nm, completely etching the SiO$_2$ mask layer away of the exposed part of the surface by a buffer oxide etching (BOE) solution, and then removing the photoresist layer from the wafer surface by organic solvents such as acetone and ethanol, thereby forming a SiO$_2$-based ion implantation mask on the surface of the N-type SiC lightly-doped epitaxial layer 3;

Step 104: performing selective-area ion implantation of Al ions into the surface of the N-type SiC lightly-doped epitaxial layer 3 for multiple times with different energies to obtain a uniform doping concentration profile, performing thermal annealing treatment (1650° C., 30 min) to activate impurities, and removing the SiO$_2$ ion implantation mask layer and other structures from the surface of the epitaxial wafer through standard etching and cleaning, thereby forming a grid-bar-shaped P-type well region 4 with a doping concentration of about $3\times10^{18}$ cm$^{-3}$;

Step 105: sequentially depositing metal Ni/Ti/Al/Au with a thickness being about 35/50/100/100 nm on the back of the N-type SiC substrate 2 by a physical vapor deposition (PVD) method, putting the processed wafer with the deposited metal into an annealing furnace for high-temperature annealing at 850° C. and under a nitrogen atmosphere for 3 min, thereby forming an N-type ohmic contact lower electrode 1;

Step 106: depositing a SiO$_2$ passivation layer 7 with a thickness of 500 nm on the surface of the processed wafer by a plasma-enhanced chemical vapor deposition (PECVD) method, defining an optical window through photolithography and development, and removing the SiO$_2$ passivation layer at the window region through wet chemical etching to define the device active region;

Step 107: depositing metal Ni with a thickness of about 200 nm on the surface of the P-type well region 4 by the PVD method, putting the epitaxial wafer with the deposited metal into an annealing furnace for high-temperature annealing under a vacuum condition and at 850° C. for 3 min, thereby forming a P-type ohmic contact upper electrode 5;

Step 108: sequentially depositing metal Ti/Au with thickness being about 500/500 nm at an edge position of the P-type ohmic contact upper electrode 5 by the PVD method, thereby forming a metal conductive electrode 6; and Step 109: dicing the epitaxial wafer into single dies, wire bonding a finished die onto a TO package, and performing further electro-optical test during which the N-type ohmic contact lower electrode 1 is connected with a positive voltage and the metal conductive electrode 6 is grounded.

According to the novel SiC-based lateral PN junction EUV detector provided by Embodiment 1, the loss generated when the EUV photons penetrate through an ohmic contact layer, a passivation layer and other non-active regions on the surface of a traditional structure PN junction detector is effectively avoided, so that the detection efficiency of the detector in EUV wavelength band is effectively improved; and compared with a traditional Schottky junction EUV detector with the drawback that its detection performance is easily affected by a change of the Schottky barrier height, the novel SiC-based lateral PN junction EUV detector has good temperature stability, strong radiation resistance and thus has potential of working stably for a long time in a strong-radiation and high-temperature environment.

Through comparison between the novel SiC-based lateral PN junction EUV detector provided by Embodiment 1 and a SiC-based n-i-p type EUV detector with ultrathin n-type ohmic contact layer, on one hand, the two detectors have completely different structures and belong to completely different solutions, the novel SiC-based lateral PN junction EUV detector is a lateral junction device formed by selective-area ion implantation, and the SiC-based n-i-p type EUV detector with ultrathin N-type ohmic contact layer is a fully vertical structure device, thus carrier collection modes of the two detectors are different, and the SiC-based n-i-p type EUV detector with ultrathin N-type ohmic contact layer has a larger lateral series resistance; and on the other hand, the novel SiC-based lateral PN junction EUV detector can effectively avoid the device performance fluctuation caused by the epitaxial memory effect and cavity contamination of growing both n and p layers, and meanwhile, the device does not easily suffer from fabrication processes affecting interface qualities, such as surface-etching treatment. In the preparation process of the device, the process window is wide, and thus the device's fabrication process is well-adapted and the industrialized mass production is feasible.

Figure 3:
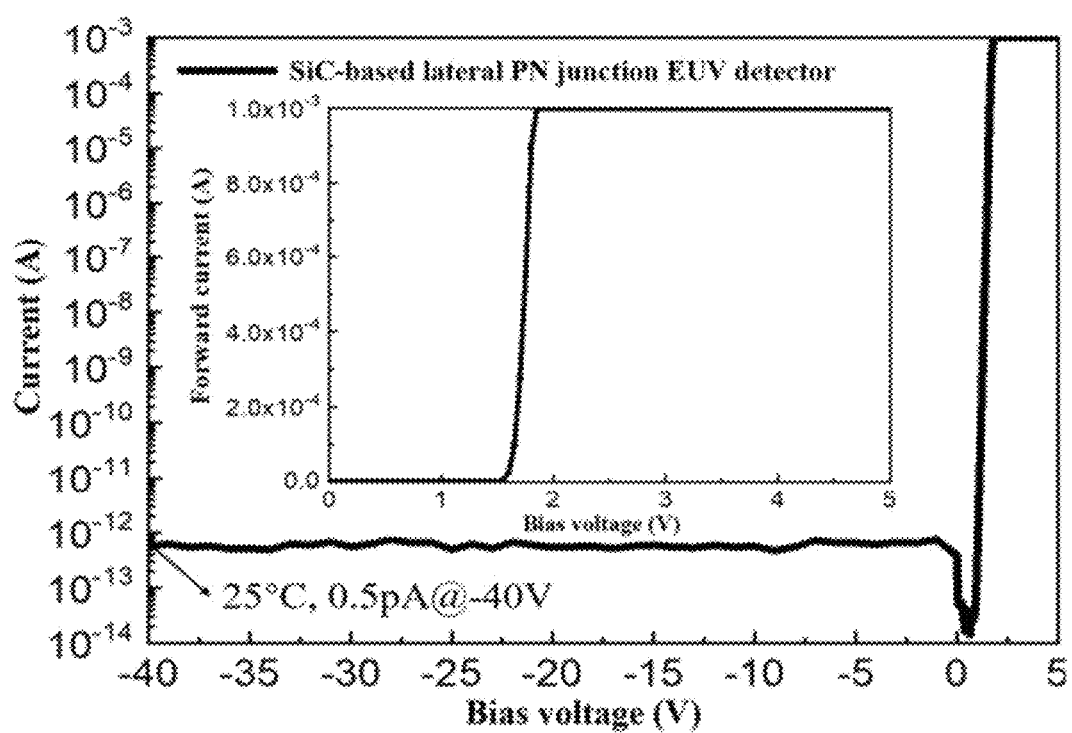
FIG. 3 shows a current-voltage characteristic curve of the novel SiC-based lateral PN junction EUV detector based on selective-area ion implantation according to Embodiment 1 of the present invention; the inset shows the forward current-voltage characteristic curve of the same device plotted in linear scale.

It can be seen from FIG. 3 that for the novel SiC-based lateral PN junction EUV detector based on selective-area ion implantation provided by Embodiment 1, its leak current at room temperature and under a reverse bias voltage of ~40 V is ~0.5 pA, corresponding to a leakage current density of ~8 pA/cm$^2$ for a device active area of 2.5×2.5 mm$^2$, and thus the device has very low noise level and is suitable for weak signal detection.

Figure 4:
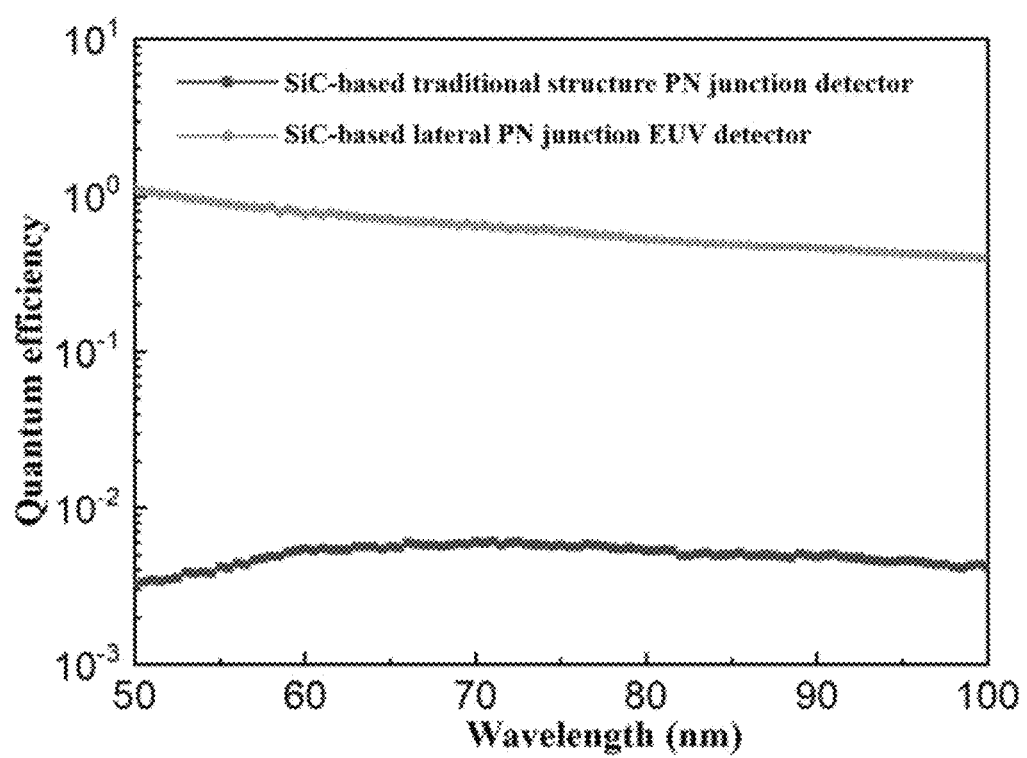
FIG. 4 shows quantum efficiency curves of the novel SiC-based lateral PN junction EUV detector based on selective-area ion implantation according to Embodiment 1 of the present invention and a control traditional structure PN junction ultraviolet detector in a wavelength range of 50-100 nm.

FIG. 4 shows the quantum efficiency curves (@bias voltage −40 V) of the novel SiC-based lateral PN junction EUV detector based on selective-area ion implantation provided by Embodiment 1 and a control SiC-based traditional structure PN junction ultraviolet detector in a wavelength range of 50-100 nm. It can be seen from FIG. 4 that in the wavelength range with a photon penetration depth of ~10-33 nm in SiC, the quantum efficiency of the novel SiC-based lateral PN junction EUV detector based on selective-area ion implantation is much higher than that of the traditional structure PN junction detector, which verifies the feasibility of the lateral PN junction structure formed by selective-area ion implantation in Embodiment 1 in reducing the EUV photon loss in the non-active surface region of the device and thus improving the detection efficiency of the device in EUV band.

Figure 5:
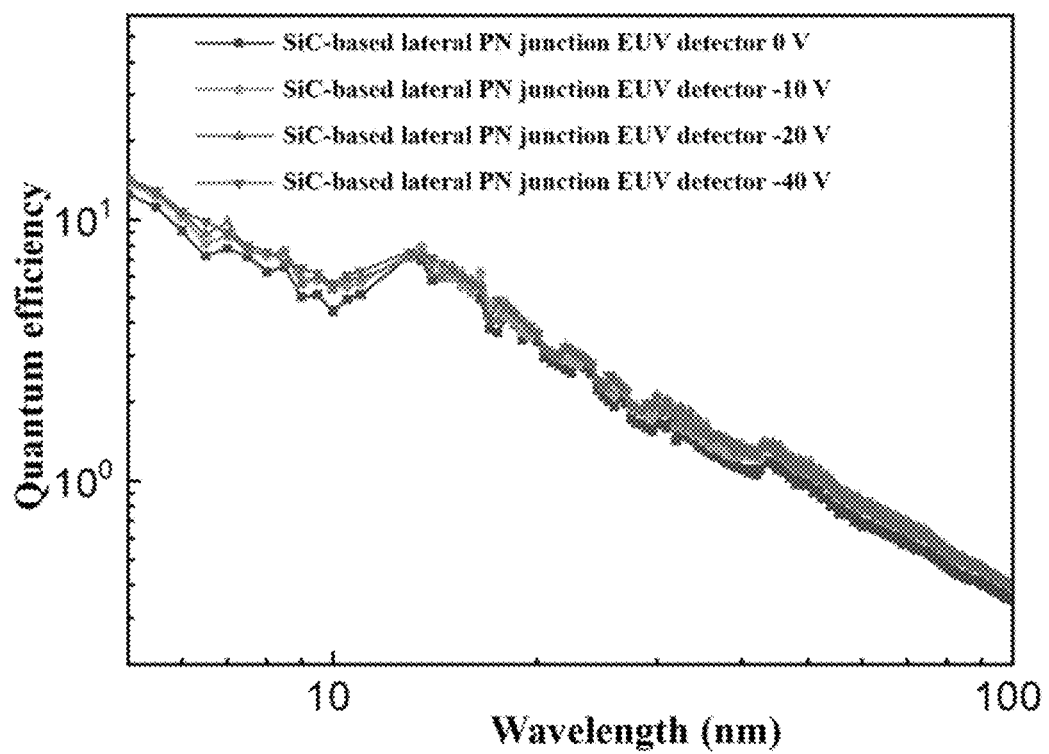
FIG. 5 shows quantum efficiency curve of the novel SiC-based lateral PN junction EUV detector based on selective-area ion implantation according to Embodiment 1 of the present invention under reverse bias voltages of 0 V, −10 V, −20 V and −40 V and in a wavelength range of 5-100 nm.

FIG. 5 shows the quantum efficiency curves of the novel SiC-based lateral PN junction EUV detector based on selective-area ion implantation provided by Embodiment 1 under bias voltages of 0 V, −10 V, −20 V and −40 V and in a wavelength range of 5-100 nm. It can be seen from FIG. 5 that the quantum efficiency of the novel SiC-based lateral PN junction EUV detector based on selective-area ion implantation increases gradually with the increase of the bias voltage and finally tends to saturate, which is mainly because that with the increase of reverse bias voltage, the electric field strength of the device junction region gradually increases and the collection efficiency of photocarriers also increases accordingly; in addition, the depletion region of the device is expanded at the same time, which also improves the quantum efficiency of the device. The fill factor of the novel SiC-based lateral PN junction EUV detector based on selective-area ion implantation provided by Embodiment 1 is 40%, and its quantum efficiency is about 692.5%@13.5 nm; and in a case that the fill factor of the detector is 10%, its quantum efficiency may be up to 1038.75%@13.5 nm, approaching the theoretical highest quantum efficiency of 1177.59% @ 13.5 nm.

Figure 6:
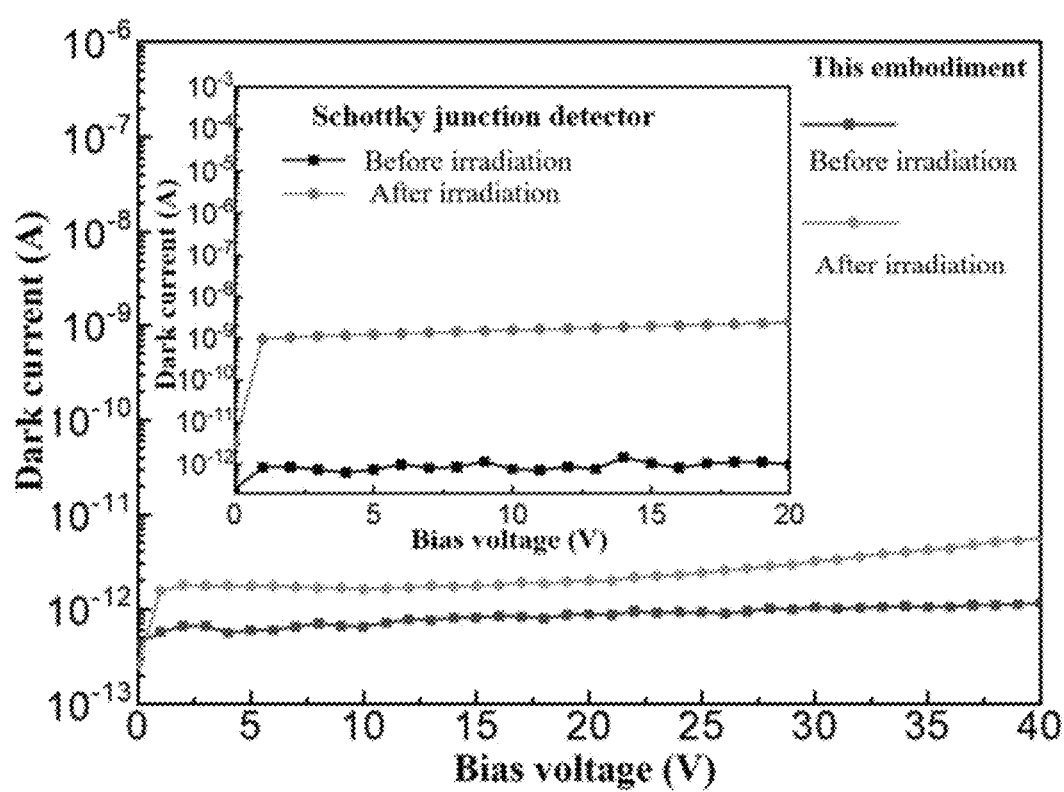
FIG. 6 shows dark current curves of the novel SiC-based lateral PN junction EUV detector based on selective-area ion implantation according to Embodiment 1 of the present invention before and after irradiation; the inset shows dark current curves of a control Schottky junction EUV detector with a same size before and after irradiation.

FIG. 6 shows the dark current-voltage curves of the novel SiC-based lateral PN junction EUV detector based on selective-area ion implantation provided by Embodiment 1 and a control Schottky junction EUV detector (202010309443.4) before and after continuous 12-hour irradiation under a 13.5 nm EUV light source. It can be seen from FIG. 6 that after the 12-hour irradiation under the 13.5 nm EUV light source, the dark current of the control Schottky junction detector increases from $10^{-12}$ A to $10^{-9}$ A, while the dark current of the novel SiC-based lateral PN junction EUV detector based on selective-area ion implantation in the present invention remains at the magnitude of $10^{-12}$ A. This proves that the novel SiC-based lateral PN junction EUV detector based on selective-area ion implantation of the present invention has high irradiation stability.

Figure 7:
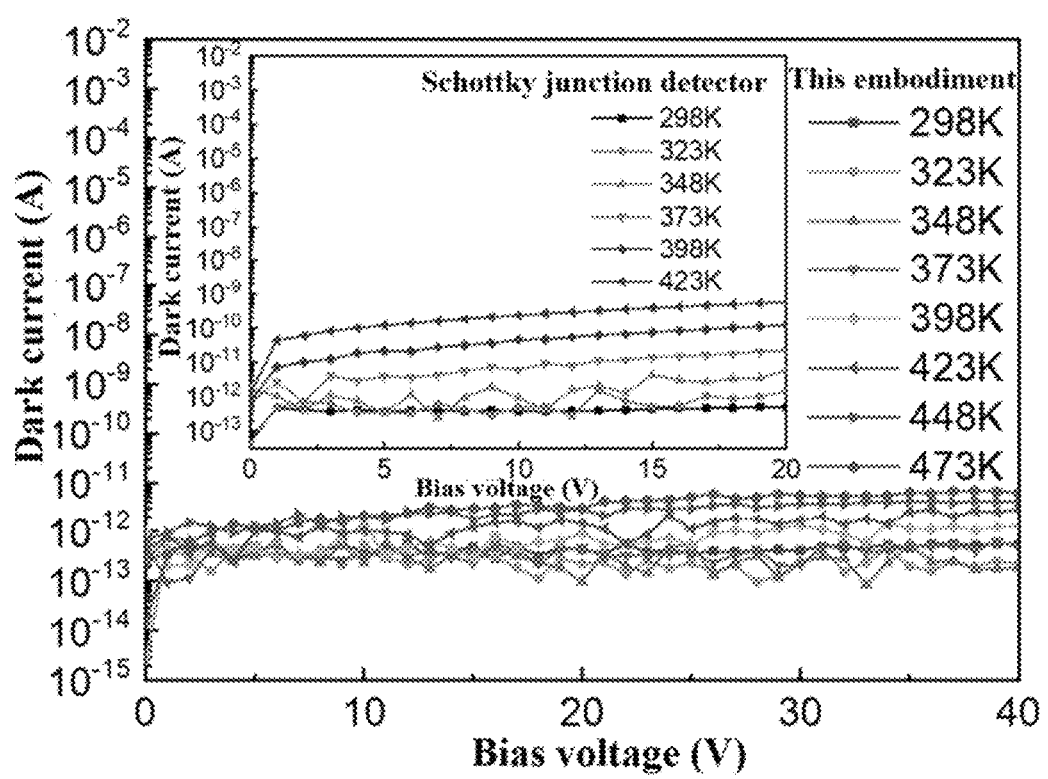
FIG. 7 shows dark current curves of the novel SiC-based lateral PN junction EUV detector based on selective-area ion implantation according to Embodiment 1 of the present invention at different working temperatures; the inset shows dark current curves of a control Schottky junction EUV detector with a same size at different working temperatures.

FIG. 7 shows the dark current-voltage curves of the novel SiC-based lateral PN junction EUV detector based on selective-area ion implantation provided by Embodiment 1 and a control Schottky junction EUV detector (202010309443.4) with a same size at different working temperatures. It can be seen from FIG. 7 that with working temperature increases from 298 K to 423 K, the dark current of the Schottky junction EUV detector under −20 V increases from $5\times10^{-13}$ A to $5\times10^{-10}$ A, corresponding to 1000 times increase of dark current; while the dark current of the novel SiC-based lateral PN junction EUV detector based on selective-area ion implantation of the present invention under −40 V only increases to $2.7\times10^{-12}$ A at 473 K. The above result indicates that the novel SiC-based lateral PN junction EUV detector based on selective-area ion implantation provided by the present embodiment has excellent temperature stability.

What is claimed is:

1. A novel silicon carbide-based lateral PN junction extreme ultraviolet detector based on selective-area ion implantation, comprising an N-type ohmic contact lower electrode, an N-type substrate and a lightly-doped epitaxial layer which are connected sequentially from bottom to top, wherein the lightly-doped epitaxial layer is an N-type lightly-doped epitaxial layer or a P-type lightly-doped epitaxial layer; in a case that the lightly-doped epitaxial layer is an N-type lightly-doped epitaxial layer, a P-type well region is formed on a surface of the N-type lightly-doped epitaxial layer through selective-area ion implantation, a P-type ohmic contact upper electrode is arranged on the P-type well region, and the P-type ohmic contact upper electrode is provided with a metal conductive electrode along its periphery; in a case that the lightly-doped epitaxial layer is a P-type lightly-doped epitaxial layer, an N-type well region is formed on a surface of the P-type lightly-doped epitaxial layer through selective-area ion implantation, an N-type ohmic contact upper electrode is arranged on the N-type well region, and the N-type ohmic contact upper electrode is provided with a metal conductive electrode along its periphery;

the P-type or N-type well region is distributed on the surface of the N-type or P-type lightly-doped epitaxial layer at intervals; and a fill factor of the P-type or N-type well region is 10-90%.

2. The novel silicon carbide-based lateral PN junction extreme ultraviolet detector based on selective-area ion implantation according to claim 1, wherein in a case that the lightly-doped epitaxial layer is a P-type lightly-doped epitaxial layer, a P-type heavily-doped epitaxial layer is arranged between the P-type lightly-doped epitaxial layer and the N-type substrate.

3. The novel silicon carbide-based lateral PN junction extreme ultraviolet detector based on selective-area ion implantation according to claim 1, wherein a doping concentration of the P-type or N-type well region is higher than $1\times10^{17}$ $cm^{3}$; and a depth of the P-type or N-type well region is lower than 1 μm.

4. The novel silicon carbide-based lateral PN junction extreme ultraviolet detector based on selective-area ion implantation according to claim 1, wherein the P-type or N-type ohmic contact upper electrode is arranged on the P-type or N-type well region, and a width of the P-type or N-type ohmic contact upper electrode is less than a width of the P-type or N-type well region.

5. The novel silicon carbide-based lateral PN junction extreme ultraviolet detector based on selective-area ion implantation according to claim 4, wherein the P-type or N-type well region and the P-type or N-type ohmic contact upper electrode are of grid bar shapes, mesh shapes and ring shapes.

6. The novel silicon carbide-based lateral PN junction extreme ultraviolet detector based on selective-area ion implantation according to claim 1, wherein a material of the N-type or P-type lightly-doped epitaxial layer is silicon carbide, a doping concentration of the N-type or P-type lightly-doped epitaxial layer is less than $1\times10^{16}$ $cm^{-3}$, and the thickness of the N-type or P-type lightly-doped epitaxial layer is greater than 1 μm; and a material of the N-type substrate is silicon carbide, and a doping concentration of the N-type substrate is $1\times10^{18}$ $cm^{-3}$ to $1\times10^{20}$ $cm^{-3}$.

7. The novel silicon carbide-based lateral PN junction extreme ultraviolet detector based on selective-area ion implantation according to claim 1, wherein a material of the N-type ohmic contact lower electrode is at least one of nickel, titanium, aluminum or gold; a material of the P-type or N-type ohmic contact upper electrode is at least one of nickel, titanium, aluminum or gold; and a material of the metal conductive electrode is at least one of titanium or gold, and a total thickness of the metal conductive electrode is at least 1 μm.

8. The novel silicon carbide-based lateral PN junction extreme ultraviolet detector based on selective-area ion implantation according to claim 7, wherein the N-type ohmic contact lower electrode comprises a nickel layer, a titanium layer, an aluminum layer or a gold layer which are connected sequentially from top to bottom; the P-type or N-type ohmic contact upper electrode is a nickel layer; and the metal conductive electrode comprises a titanium layer and a gold layer which are connected sequentially from bottom to top.

9. A preparation method of the novel silicon carbide-based lateral PN junction extreme ultraviolet detector based on selective-area ion implantation according to claim 1, sequentially comprising the following steps:
- in step 1) epitaxially growing an-the N-type or P-type lightly-doped epitaxial layer on the upper surface of an N-type substrate;
- in step 2) depositing a mask layer on the N-type or P-type lightly-doped epitaxial layer and spin-coating a photoresist layer on the mask layer, and forming a photoresist pattern through exposure and development to define an ion implantation mask region;
- in step 3) etching the mask layer by taking the photoresist pattern as a mask, and forming an ion implantation mask on the surface of the N-type or P-type lightly-doped epitaxial layer;
- in step 4) performing selective-area ion implantation on the surface of the N-type or P-type lightly-doped epitaxial layer to form—a-the P-type or N-type well region, and performing thermal annealing treatment to activate impurities;
- in step 5) depositing an-the N-type ohmic contact lower electrode on the lower surface of the N-type substrate, and performing high-temperature annealing to form an N-type ohmic contact;
- in step 6) spin-coating a photoresist layer on the surface of the N-type or P-type lightly-doped epitaxial layer, according to a photolithography pattern obtained through exposure and development, depositing-a-the P-type or N-type ohmic contact upper electrode on the P-type or N-type well region formed by the selective-area ion implantation, and performing high-temperature annealing to form a P-type ohmic contact or the N-type ohmic contact; and
- in step 7) depositing a metal conductive electrode at an edge position of the P-type or N-type ohmic contact upper electrode to complete the preparation of the novel silicon carbide-based lateral PN junction extreme ultraviolet detector based on selective-area ion implantation.

10. The preparation method for the novel silicon carbide-based lateral PN junction extreme ultraviolet detector based on selective-area ion implantation according to claim 9, wherein P-type or N-type well region distributed at intervals is prepared, and the preparation method comprises:
- in step 1) in a case that the lightly-doped epitaxial layer is a P-type lightly-doped epitaxial layer, epitaxially growing a P-type heavily-doped epitaxial layer on the upper surface of the N-type substrate, and then epitaxially growing the P-type lightly-doped epitaxial layer on the P-type heavily-doped epitaxial layer;
- in step 2) depositing a mask layer on the N-type or P-type lightly-doped epitaxial layer and spin-coating a photoresist layer on the mask layer, and forming a photoresist pattern through exposure and development to define an ion implantation mask region;
- in step 3) etching the mask layer on the N-type or P-type lightly-doped epitaxial layer at intervals according to the photolithography pattern obtained by exposure and development, so that a partial region on the N-type or P-type lightly-doped epitaxial layer remains the mask layer as the ion implantation mask;
- in step 4), forming the P-type or N-type well region distributed at intervals on the N-type or P-type lightly-doped epitaxial layer through P-type or N-type ion implantation, the region on the surface of the N-type or P-type lightly-doped epitaxial layer where the mask layer remains forms the active absorption region;
- in step 5) depositing the N-type ohmic contact lower electrode on the lower surface of the N-type substrate, and performing high-temperature annealing to form an N-type ohmic contact;
- in step 6), depositing the P-type or N-type ohmic contact upper electrode distributed at intervals along the direction of the P-type or N-type well region and not beyond the P-type or N-type well region; and
- in step 7) depositing a metal conductive electrode at an edge position of the P-type or N-type ohmic contact upper electrode to complete the preparation of the novel silicon carbide-based lateral PN junction extreme ultraviolet detector based on selective-area ion implantation.

\* \* \* \* \*